United States Patent
Ohta et al.

(10) Patent No.: US 8,866,126 B2
(45) Date of Patent: Oct. 21, 2014

(54) ANISOTROPIC STRAIN CONTROL IN SEMIPOLAR NITRIDE QUANTUM WELLS BY PARTIALLY OR FULLY RELAXED ALUMINUM INDIUM GALLIUM NITRIDE LAYERS WITH MISFIT DISLOCATIONS

(71) Applicant: The Regents of the University of California, Oakland, CA (US)

(72) Inventors: Hiroaki Ohta, Tokyo (JP); Feng Wu, Goleta, CA (US); Anurag Tyagi, Goleta, CA (US); Arpan Chakraborty, Goleta, CA (US); James S. Speck, Goleta, CA (US); Steven P. DenBaars, Goleta, CA (US); Shuji Nakamura, Santa Barbara, CA (US); Erin C. Young, Santa Barbara, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 13/904,908

(22) Filed: May 29, 2013

(65) Prior Publication Data
US 2013/0259080 A1 Oct. 3, 2013

Related U.S. Application Data

(63) Continuation of application No. 12/861,652, filed on Aug. 23, 2010, now Pat. No. 8,481,991.

(60) Provisional application No. 61/236,059, filed on Aug. 21, 2009, provisional application No. 61/236,058, filed on Aug. 21, 2009.

(51) Int. Cl.
| | | |
|---|---|---|
| H01L 33/12 | (2010.01) | |
| B82Y 20/00 | (2011.01) | |
| H01L 21/02 | (2006.01) | |
| H01S 5/34 | (2006.01) | |
| H01S 5/32 | (2006.01) | |
| H01L 33/00 | (2010.01) | |
| H01S 5/343 | (2006.01) | |
| H01S 5/22 | (2006.01) | |
| H01L 33/32 | (2010.01) | |
| H01L 33/16 | (2010.01) | |

(52) U.S. Cl.
CPC ............... *H01L 33/12* (2013.01); *B82Y 20/00* (2013.01); *H01L 21/02433* (2013.01); *H01S 5/3403* (2013.01); *H01S 5/32* (2013.01); *H01L 21/0242* (2013.01); H01S 2301/173 (2013.01); H01S 5/2201 (2013.01); H01L 33/32 (2013.01); *H01L 33/0075* (2013.01); *H01L 21/02389* (2013.01); *H01S 5/3202* (2013.01); *H01S 5/34333* (2013.01); *H01S 5/3201* (2013.01); *H01L 33/16* (2013.01); *H01L 21/0254* (2013.01)
USPC ............... 257/14; 257/E29.168; 257/E21.09; 438/47

(58) Field of Classification Search
CPC ........................................ H01L 33/12
USPC .................. 257/14, E29.168, E21.09; 438/47
See application file for complete search history.

(56) References Cited

U.S. PATENT DOCUMENTS

| | | | |
|---|---|---|---|
| 8,179,943 B2 | 5/2012 | Okhotnikov et al. | |
| 8,481,991 B2 * | 7/2013 | Ohta et al. | ..................... 257/14 |

(Continued)

FOREIGN PATENT DOCUMENTS

| | | |
|---|---|---|
| JP | 2010114418 | 5/2010 |
| WO | WO2006106170 | 10/2006 |
| WO | 2009097622 | 8/2009 |

OTHER PUBLICATIONS

Extended European Search Report dated Sep. 5, 2013 for European Patent Application No. 10810724.4.

(Continued)

*Primary Examiner* — Marc Armand
(74) *Attorney, Agent, or Firm* — Gates & Cooper LLP

(57) ABSTRACT

An epitaxial structure for a III-Nitride based optical device, comprising an active layer with anisotropic strain on an underlying layer, where a lattice constant and strain in the underlying layer are partially or fully relaxed in at least one direction due to a presence of misfit dislocations, so that the anisotropic strain in the active layer is modulated by the underlying layer.

22 Claims, 16 Drawing Sheets

(56) References Cited

U.S. PATENT DOCUMENTS

| | | | |
|---|---|---|---|
| 2002/0192959 A1 | 12/2002 | Shibata et al. | |
| 2003/0092230 A1 | 5/2003 | Koike et al. | |
| 2004/0017835 A1 | 1/2004 | Jewell et al. | |
| 2004/0169184 A1 | 9/2004 | Udagawa et al. | |
| 2005/0059257 A1 | 3/2005 | Fukuyama et al. | |
| 2006/0027831 A1 | 2/2006 | Kioke et al. | |
| 2006/0205199 A1 | 9/2006 | Baker et al. | |
| 2006/0270076 A1* | 11/2006 | Imer et al. | 438/22 |
| 2007/0101932 A1 | 5/2007 | Schowalter et al. | |
| 2008/0191192 A1 | 8/2008 | Feezell et al. | |
| 2008/0198881 A1 | 8/2008 | Farrell et al. | |
| 2008/0220555 A1 | 9/2008 | Saxler et al. | |
| 2009/0194761 A1 | 8/2009 | Masui et al. | |
| 2009/0252191 A1 | 10/2009 | Kubota et al. | |
| 2010/0046567 A1 | 2/2010 | Liliental-Weber et al. | |
| 2010/0051900 A1 | 3/2010 | Huffaker et al. | |
| 2010/0264460 A1 | 10/2010 | Grandusky et al. | |
| 2011/0049568 A1 | 3/2011 | Lochtefeld et al. | |
| 2011/0062415 A1 | 3/2011 | Ohta et al. | |
| 2011/0182311 A1 | 7/2011 | Yoshizumi et al. | |
| 2011/0309328 A1 | 12/2011 | Kyono et al. | |
| 2012/0091465 A1 | 4/2012 | Krames et al. | |
| 2012/0100650 A1 | 4/2012 | Speck et al. | |
| 2012/0104360 A1 | 5/2012 | Hardy et al. | |
| 2012/0114002 A1 | 5/2012 | Enya et al. | |

OTHER PUBLICATIONS

Baker, Troy J., et al., "Characterization of Planar Semipolar Gallium Nitride Films on Spinel Substrates", Japanese Journal of Applied Physics (JJAP), 2005, pp. 920-922, vol. 44, No. 29, XP-002601934.

Sawaki, Nobuhiko, et al., "Growth and properties of semi-polar GaN on a patterned silicon substrate", Journal of Crystal Growth, 2009, pp. 2867-2874, vol. 311, No. 10, XP-026140890.

Tyagi, Anurag, et al., "Partial strain relaxation via misfit dislocation generation at heterointerfaces in Al,In)GaN epitaxial layers grown on semipolar (1122) GaN free standing substrates", Applied Physics Letters 95, 2009, 251905.

Extended European Search Report dated Sep. 5, 2013 for European Patent Application No. 10810719.4.

PCT Search Report dated Oct. 12, 2010 (PCT/US2010/046376).

Yamaguchi, A.A., "Theoretical investigation on polarization control of semipolar-oriented InGaN quantum-well emission using (Al)InGaN alloy substrates", Applied Physics Letters, 2009, pp. 201104-1-201104-3, vol. 94.

Yamaguchi, A.A., "Anisotropic Optical Matrix Elements in Strained GaN Quantum Wells on Semipolar and Nonpolar Substrates", Japanese Journal of Applied Physics, 2007, pp. L789-L791, vol. 46, No. 33.

Yamaguchi, A.A., "Anisotropic optical matrix elements in strained GaN-quantum wells with various substrate orientations", Phys. Stat. Sol (c), 2008, pp. 2329-2332, vol. 5, No. 6.

Vurgaftman, I, et al., "Band parameters for nitrogen-containing semiconductors", Journal of Applied Physics, Sep. 1, 2003, pp. 3675-3696, vol. 94, No. 6.

Speck, James S., "Progress in Nonpolar Materials and Devices", Presentation Slides at the 2009 Annual Review for the Solid State Lighting and Energy Center (SSLEC), University of California, Santa Barbara.

Young, Erin, et al., "Lattice Tilt and Misfit Dislocations in (1122) Semipolar GaN Heteroepitaxy", Applied Physics Express, 2010, pp. 011004-1-011004-3, vol. 3.

Sasaki et al., "Substrate-orientation dependence of GaN signle-crystal films grown by metalorganic vapor-phase epitaxy". Journal of Applied Physics, vol. 61, No. 7 (1987), pp. 2533-2540.

Chuang, S., Physics of Optoelectronic Devices, pp. 146-154.

Asamizu, Hirokuni et al., "Demonstration of 426nm InGaN/GaN Laser Diodes Fabricated on Free-Standing Semipolar (1122) Gallium Nitride Substrates", Applied Physics Express 1 (2008).

Wu, F., et al., "Misfit dislocation formation at heterointerfaces in (Al,In)GaN heteroepitaxial layers grown on semipolar free-standing substrates", Journal of Applied Physics 109 (2011).

Srinivasan S., et al., "Slip systems and misfit dislocations in InGaN epilayers", Applied Physics Letters, Dec. 22, 2003, vol. 83, No. 25.

Romanov, A.E., et al., "Stress relaxation in mismatched layers due to threading dislocation inclination" Applied Physics Letters, Sep. 29, 2003, vol. 83, No. 13.

Floro, J.A., et al., "Misfit dislocation formation in the AlGaN/GaN heterointerface", Journal of Applied Physics, Dec. 15, 2004, vol. 96, No. 12.

Liu, R., et al., "Generation of misfit dislocations by basal-plane slip in InGaN/GaN heterostructures", Applied Physics Letters 89, (2006).

Enya, Yohei, et al., "531nm Green Lasing of InGaN Based Laser Diodes on Semi-Polar {2021} Free-Standing GaN Substrates", Applied Physics Express 2 (2009).

PCT Search Report, PCT/US2010/046341, dated Oct. 7, 2010.

Japanese Office Action (with English translation) dated Mar. 14, 2014 for Japanese Patent Application No. 2012-525757.

Chinese Office Action (with English translation) dated Jun. 3, 2014 for Chinese Patent Application No. 201080037329.5.

\* cited by examiner

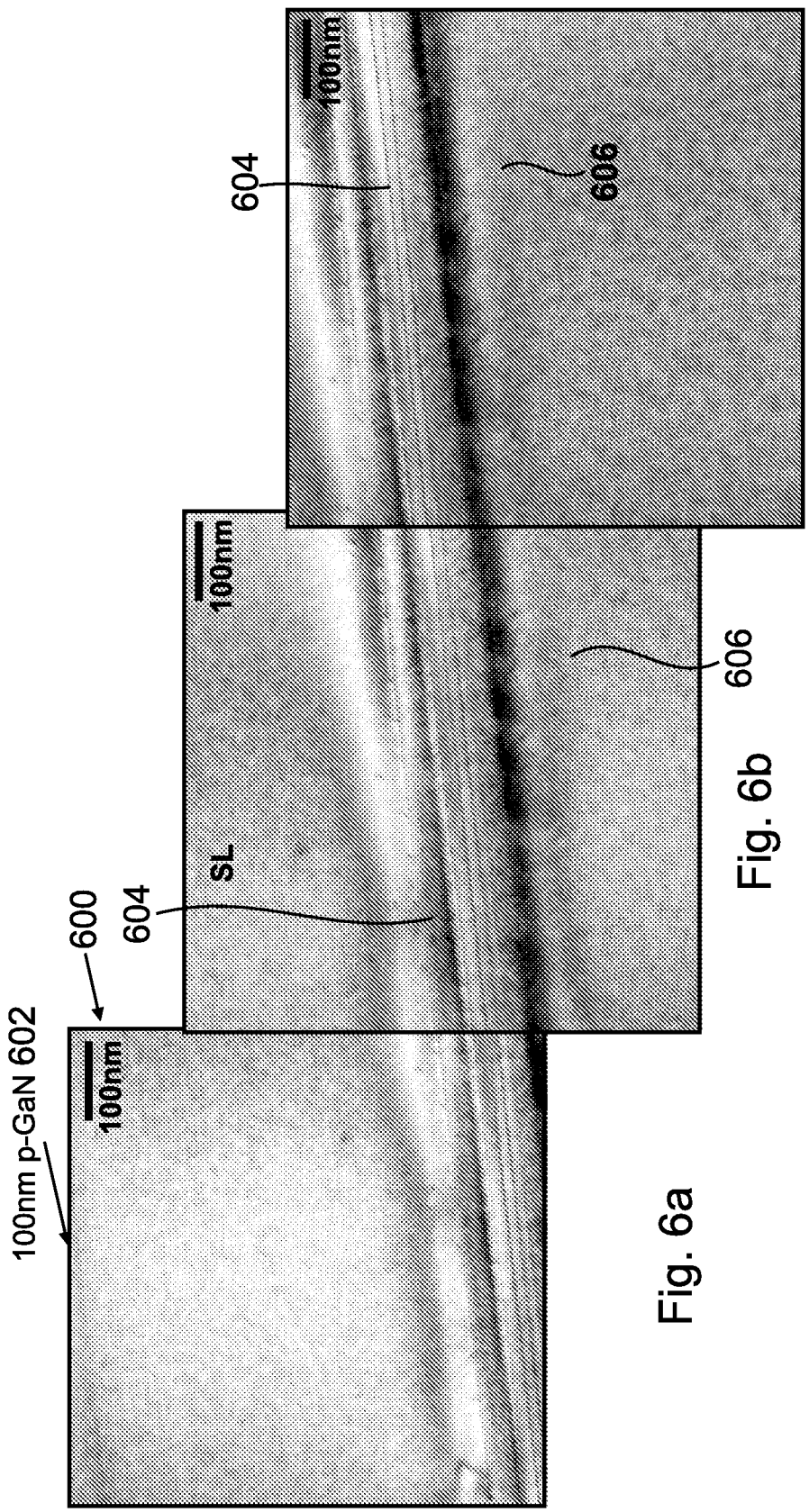

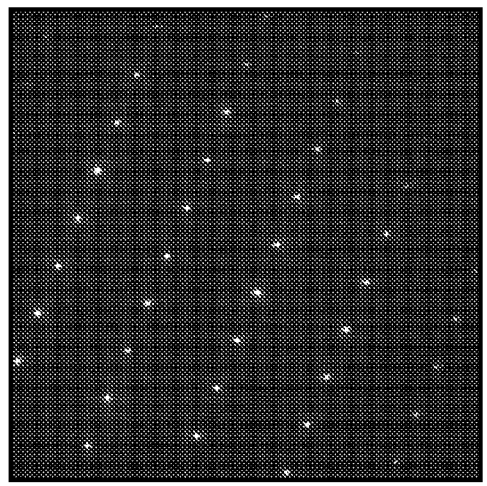
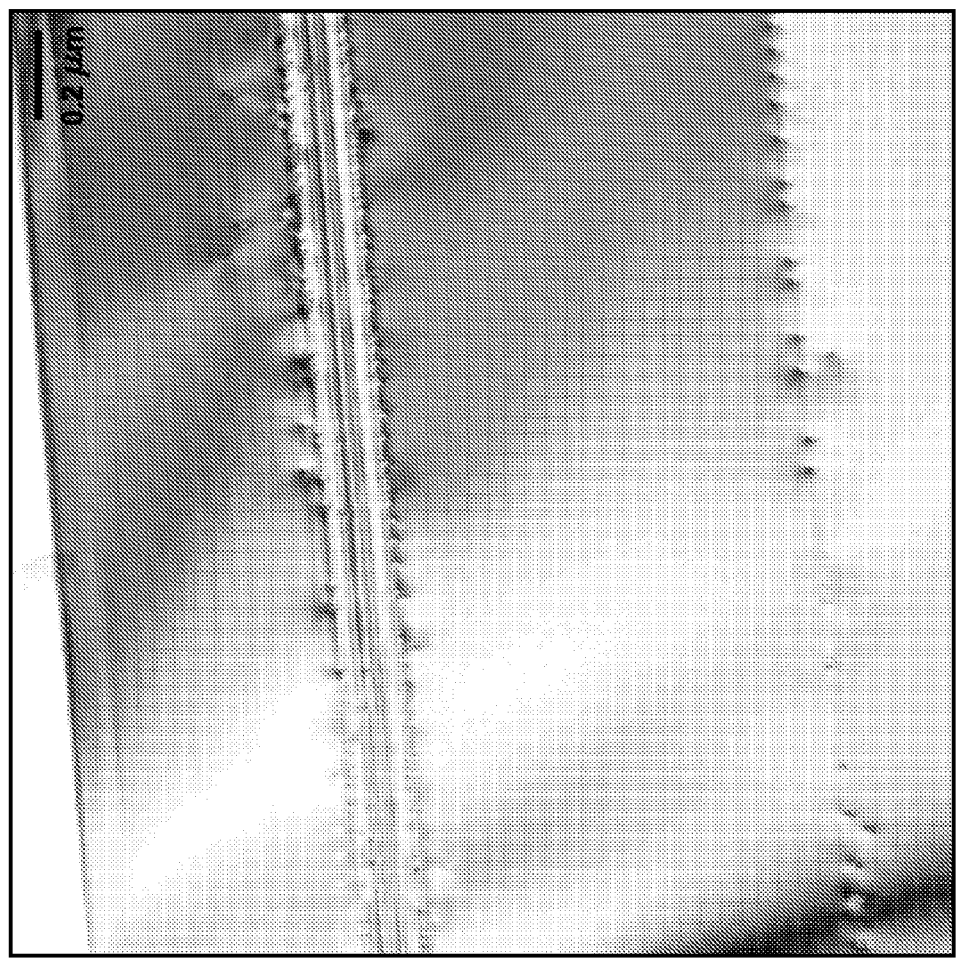
Fig. 8b
Fig. 8a

ANISOTROPIC STRAIN CONTROL IN SEMIPOLAR NITRIDE QUANTUM WELLS BY PARTIALLY OR FULLY RELAXED ALUMINUM INDIUM GALLIUM NITRIDE LAYERS WITH MISFIT DISLOCATIONS

CROSS REFERENCE TO RELATED APPLICATIONS

This application is a continuation under 35 U.S.C. §120 of the following co-pending and commonly-assigned U.S. patent application:

U.S. Utility patent application Ser. No. 12/861,652, filed on Aug. 23, 2010, by Hiroaki Ohta, Feng Wu, Anurag Tyagi, Arpan Chakraborty, James S. Speck, Steven P. DenBaars, Shuji Nakamura, and Erin C. Young, entitled "ANISOTROPIC STRAIN CONTROL IN SEMIPOLAR NITRIDE QUANTUM WELLS BY PARTIALLY OR FULLY RELAXED ALUMINUM INDIUM GALLIUM NITRIDE LAYERS WITH MISFIT DISLOCATIONS,", which application claims the benefit under 35 U.S.C. Section 119(e) of the following and commonly assigned U.S. Provisional Patent Applications:

U.S. Provisional Patent Application Ser. No. 61/236,059 filed on Aug. 21, 2009, by Hiroaki Ohta, Feng Wu, Anurag Tyagi, Arpan Chakraborty, James S. Speck, Steven P. DenBaars and Shuji Nakamura, entitled "ANISOTROPIC STRAIN CONTROL IN SEMIPOLAR NITRIDE QUANTUM WELLS BY PARTIALLY OR FULLY RELAXED ALUMINUM INDIUM GALLIUM NITRIDE LAYERS WITH MISFIT DISLOCATIONS"; and U.S. Provisional Application Ser. No. 61/236,058, filed on Aug. 21, 2009, by Hiroaki Ohta, Feng Wu, Anurag Tyagi, Arpan Chakraborty, James S. Speck, Steven P. DenBaars, and Shuji Nakamura, entitled "SEMIPOLAR NITRIDE-BASED DEVICES ON PARTIALLY OR FULLY RELAXED ALLOYS WITH MISFIT DISLOCATIONS AT THE HETEROINTERFACE,";

all of which applications are incorporated by reference herein.

This application is related to the following and co-pending commonly-assigned U.S. patent application:

U.S. Utility application Ser. No. 12/861,532 filed on Aug. 23, 2010, by Hiroaki Ohta, Feng Wu, Anurag Tyagi, Arpan Chakraborty, James S. Speck, Steven P. DenBaars, Shuji Nakamura, and Erin C. Young, entitled "SEMIPOLAR NITRIDE-BASED DEVICES ON PARTIALLY OR FULLY RELAXED ALLOYS WITH MISFIT DISLOCATIONS AT THE HETEROINTERFACE,", which application claims the benefit under 35 U.S.C. Section 119(e) of U.S. Provisional Application Ser. No. 61/236,058, filed on Aug. 21, 2009, by Hiroaki Ohta, Feng Wu, Anurag Tyagi, Arpan Chakraborty, James S. Speck, Steven P. DenBaars, and Shuji Nakamura, entitled "SEMIPOLAR NITRIDE-BASED DEVICES ON PARTIALLY OR FULLY RELAXED ALLOYS WITH MISFIT DISLOCATIONS AT THE HETEROINTERFACE,";

all of which applications are incorporated by reference herein.

BACKGROUND OF THE INVENTION

1. Field of the Invention

This invention relates to optical devices, such as Light Emitting Diodes (LEDs) and Laser Diodes (LDs), grown on templates that modulate strain in active layers, thereby modulating the active layer's band structure and polarization of emitted light.

2. Description of the Related Art (Note: This application references a number of different publications as indicated throughout the specification by one or more reference numbers within brackets, e.g., [x]. A list of these different publications ordered according to these reference numbers can be found below in the section entitled "References." Each of these publications is incorporated by reference herein.)

In references [1-3], it was shown that the presence of strain in quantum wells (QWs) can modulate the band structure of QWs (polarization of spontaneous emission and gain). This is a well-known phenomenon (see, for example, [4]). Generally, strain in semipolar nitride epitaxial layers, with hexagonal wurtzite crystal structure, is anisotropic due to the different lattice parameters, a and c (lattice anisotropy). Reference [5] reports the following values for lattice constants: a(AlN)= 3.112 Angstroms, a(GaN)=3.189 Angstroms, a(InN)=3.54 Angstroms, c(AlN)=4.982 Angstroms, c(GaN)=5.185 Angstroms, and c(InN)=5.705 Angstroms.

However, this strain-anisotropy is automatically determined by the difference of lattice constant between a considered epitaxial layer and the substrate on which the considered layer is coherently grown. Therefore, prior to the present invention, there was no way to control anisotropy of strain in QWs.

FIG. 1 illustrates the co-ordinate system used in Yamaguchi's study [1], where X2 is the c-axis projection and $\theta$ indicates the orientation of the substrate (e.g., $\theta=0$ corresponds to a c-plane substrate). FIGS. 2(a)-(c) illustrate substrate orientation dependences of the in-plane luminescence polarization degree for unstrained QWs, thick strained GaN films, and compressively strained QWs with isotropic in-plane biaxial strain. The quantum confinement effect due to thin QWs causes luminescence polarization parallel to X2, as shown in FIG. 2(a). Compressive strain, on the other hand, causes luminescence polarization parallel to X1, as shown in FIG. 2(b). FIG. 3 illustrates substrate orientation dependences of the in-plane luminescence polarization degree, for coherently grown $In_{0.3}GaN$ QWs on GaN substrates. Thus, FIGS. 2 and 3 illustrate different luminescence polarizations or band structures that result from different strain (e.g., anisotropic strain) situations. In these calculations shown in FIGS. 2 and 3, the differences in lattice constants are assumed as 3.3% and 3.0% for the a and c lattice parameters, respectively.

Thus, if strain anisotropy can be modulated, as shown in the present invention, optical properties in LEDs/LDs can be changed with a high degree of freedom.

SUMMARY OF THE INVENTION

This invention provides a method to control the anisotropy of strain in semipolar nitride-based active layers of optical/electronic devices. So far, all nitride-based devices are typically grown coherently because dislocations which pass through device layers cause poor device performance. Based on the present invention's discovery, misfit dislocations (MDs) may be restricted to regions/interfaces located far from the device layers. Therefore, the present invention enables strain control in device layers while maintaining high device performance/efficiency.

To overcome the limitations in the prior art, and to overcome other limitations that will become apparent upon reading and understanding the present specification, an epitaxial structure for a III-Nitride based optical device, comprising a III-Nitride active layer with anisotropic strain formed on a III-Nitride underlying layer (also referred to as underlayer throughout this disclosure), where a lattice constant and strain in the underlying layer are partially or fully relaxed against a substrate in at least one direction due to a presence of misfit dislocations at a heterointerface below the underlayer, so that the anisotropic strain in the active layer is modulated by the underlying layer.

The underlayer is typically relaxed along the first direction and the underlayer is typically not relaxed along the second direction perpendicular to the first direction.

In one embodiment, the substrate is a semipolar GaN substrate, the underlayer is deposited or grown on a top surface of the GaN substrate that is a semipolar plane, the underlayer is relaxed along the direction that is parallel to an in-plane c-projection of the underlayer, the underlayer is not relaxed along the m-axis direction of the underlayer, and the active layer is deposited or grown on a top surface of the underlayer that is a semipolar plane.

The substrate may be nonpolar or semipolar, producing nonpolar or semipolar devices, for example.

The MDs may be positioned to modulate the anisotropic strain such that strain in the active layer has a first strain in a first direction in the active layer and a second strain in a second direction in the active layer.

The first direction may be parallel to an in-plane c-projection (X2), the second direction may be (e.g., in the m-axis direction) perpendicular to the first direction, and the MDs may be along the first direction.

The underlayer may be grown on the substrate and the lattice constant and strain in the underlayer may be partially or fully relaxed against the substrate, such that the lattice constant in the underlayer becomes its natural value rather than being constrained to a same value as a lattice constant of the substrate and the underlayer is strain free.

The active layer may be an AlInGaN QW or multiple quantum well (MQW) (e.g., nonpolar or semipolar QWs). For example, the underlying layer may be InAlGaN, with In composition >0, and the active layer may comprise InGaN with In composition >20%. The QWs may have an In composition and thickness such that the QWs emit light having a peak wavelength in a green spectral region.

The active layer may comprise one or more QWs having a thickness greater than 3 nanometers and the MDs may be positioned to modulate the anisotropic strain such that light emitted by the QWs has a net X2 polarization.

The present invention further discloses a method of fabricating an epitaxial structure for a III-Nitride based optical device, comprising forming a III-Nitride underlayer on a substrate, so that a lattice constant and strain in the underlying layer are partially or fully relaxed against the substrate in at least one direction due to a presence of MDs at a heterointerface below the underlayer; and forming a III-Nitride active layer on the underlying layer, so that anisotropic strain in the active layer is modulated or controlled by the underlying layer.

The method may further comprise forming the MDs by forming the heterointerface between the underlayer and the substrate or layer beneath the underlayer, wherein the underlayer and the substrate or the underlayer and the layer each have a different III-Nitride alloy composition, and the misfit dislocations are localized around the heterointerface, thereby eliminating the misfit dislocations in layers around the active layer.

The method may further comprise forming the underlayer by growing the underlayer non coherently on the substrate, and forming of the active layer by growing the active layer coherently on the underlayer. An additional layer beneath the underlayer may be another underlayer that is coherently grown on the substrate.

The anisotropic strain may be modulated by a varying degree of relaxation in the underlayer as a function of direction in the underlayer, so that the underlayer's bandstructure is controlled and the active layer's bandstructure is controlled, for example.

BRIEF DESCRIPTION OF THE DRAWINGS

Referring now to the drawings in which like reference numbers represent corresponding parts throughout:

FIGS. 6(a)-(c) show TEM images of the different epitaxial layers of the aforementioned device (FIG. 4, and FIG. 5(a)) for (a) a 100 period p-AlGaN/GaN superlattice and also showing 100 nm thick p-GaN, wherein the p-AlGaN in the superlattice is 3 nm thick, the GaN in the superlattice is 2 nm thick, (b) an active region with a 2-period InGaN QW, and (c) an n-AlGaN/GaN SL below the QWs, wherein the scale is 100 nm.

FIG. 8(a) is a TEM image taken from the zone axis [2-1-10], wherein the scale is 0.2 $\mu$m, and FIG. 8(b) depicts the corresponding electron beam DP.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

An epitaxial layer (X) grown on another layer (Y), wherein layer Y could itself be epitaxial or else a substrate, can be coherent, or partially relaxed, or fully relaxed, with respect to Y. For the case of coherent growth, the in-plane lattice constant(s) of X are constrained to be the same as the underlying layer Y. If X is fully relaxed, then the lattice constants of X assume their natural (i.e. in the absence of any strain) value. If X is neither coherent nor fully relaxed with respect to Y, then it is considered to be partially relaxed. In some cases, the substrate might have some residual strain.

Thus, for the case of partially relaxed, the lattice constant in the underlayer is not completely the same as the natural value. In addition, sometimes the substrate also has small strain—however, this strain is quite small.

MDs, caused by lattice constant mismatch at heterointerfaces, may be fabricated using AlInGaN films with different alloy composition. The effect is that MDs can be spatially restricted to the close vicinity of the heterointerface(s), thereby eliminating MDs in the device layers around the QWs, and maintaining high device performance.

Technical Description

Nomenclature

The terms (Al,Ga,In)N, III-Nitride, or AlInGaN, as used herein are intended to be broadly construed to include respective nitrides of the single species, Al, Ga, and In, as well as binary, ternary and quaternary compositions of such Group III metal species. Accordingly, the term (Al, Ga, In)N, or AlInGaN, or III-Nitride, comprehends the compounds AN, GaN, and InN, as well as the ternary compounds AlGaN, GaInN, and AlInN, and the quaternary compound AlGaInN, as species included in such nomenclature. When two or more of the (Ga, Al, In) component species are present, all possible compositions, including stoichiometric proportions as well as "off-stoichiometric" proportions (with respect to the relative mole fractions present of each of the (Ga, Al, In) component species that are present in the composition), can be employed within the broad scope of the invention. Accordingly, it will be appreciated that the discussion of the invention hereinafter in primary reference to GaN materials is applicable to the formation of various other (Al, Ga, In)N material species.

Further, (Al,Ga,In)N materials within the scope of the invention may further include minor quantities of dopants and/or other impurity or inclusional materials.

In a similar manner, AlGaInBN might also be used in the present invention.

Device Structure

Figure 1:
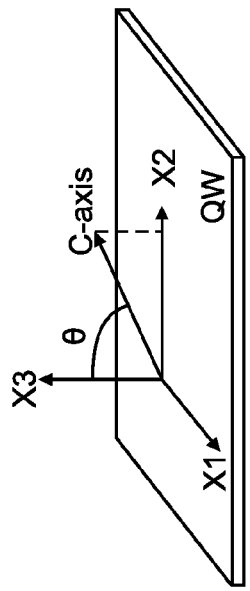
FIG. 1 illustrates the co-ordinate system used in Yamaguchi's study [1].
Figure 2:
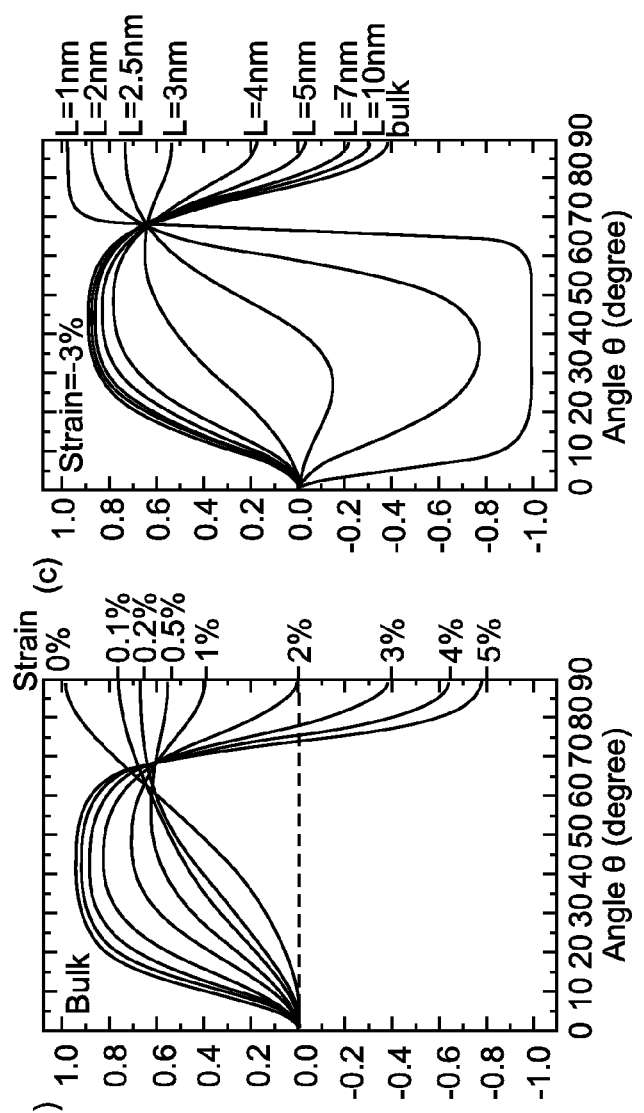
FIG. 2 illustrates substrate orientation dependences of the in-plane luminescence polarization degree for (a) unstrained QWs, (b) thick strained GaN films, and (c) compressively strained QWs with isotropic in-plane biaxial strain, wherein zero degree corresponds to polar c-plane (0001) orientation, whereas 90 degree corresponds to nonpolar a (11-20) and m (10-10) plane orientations, and intermediate angles correspond to semipolar orientations.
Figure 3:
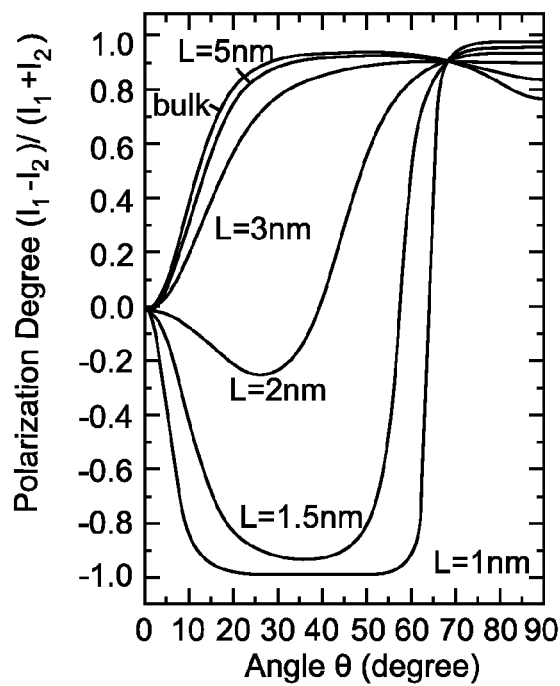
FIG. 3 illustrates substrate orientation dependences of the in-plane luminescence polarization degree for coherently grown InGaN QWs on GaN substrates.
Figure 4:
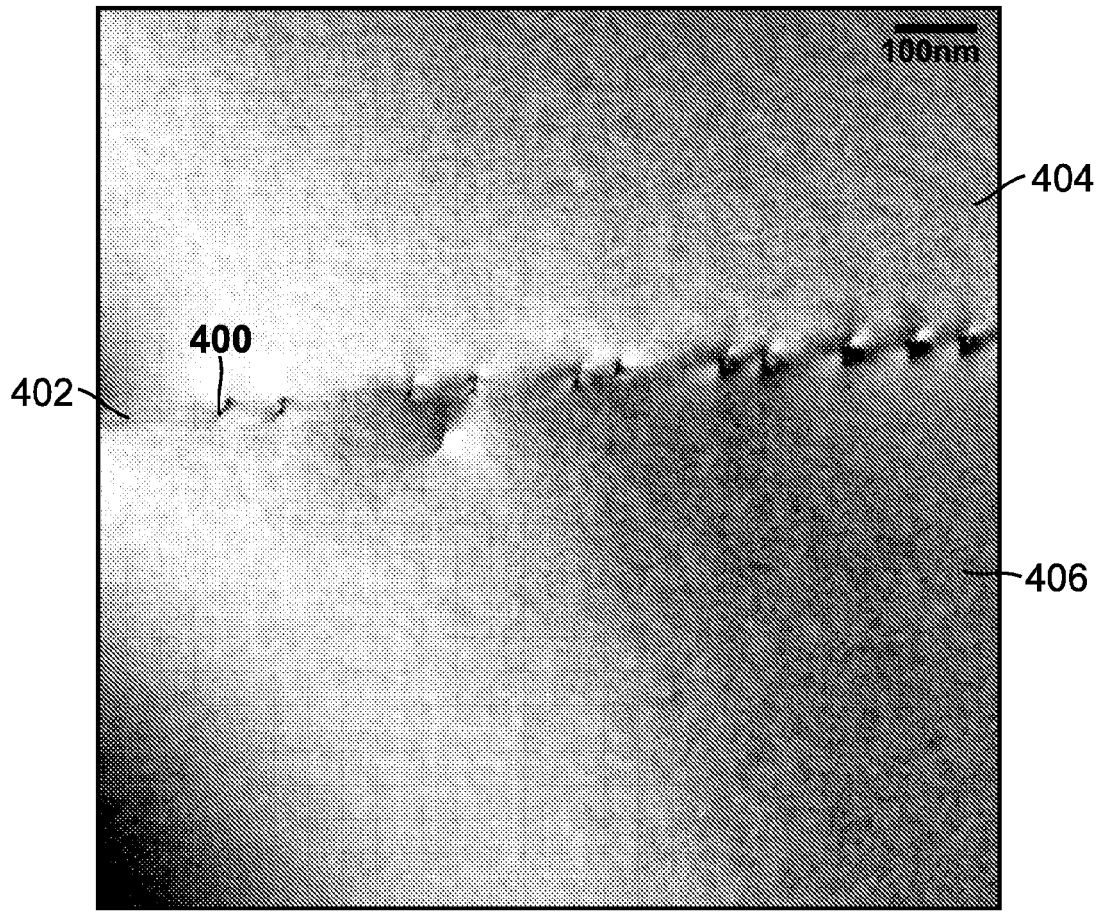
FIG. 4 is a transmission electron microscope (TEM) bright field image taken with g=01-10 diffraction condition around the interface of the lower part of a GaN/AlGaN superlattice (SL) grown on (11-22) GaN, showing MDs at the heterointerface, wherein the scale is 100 nanometers (nm).
Figure 5B:
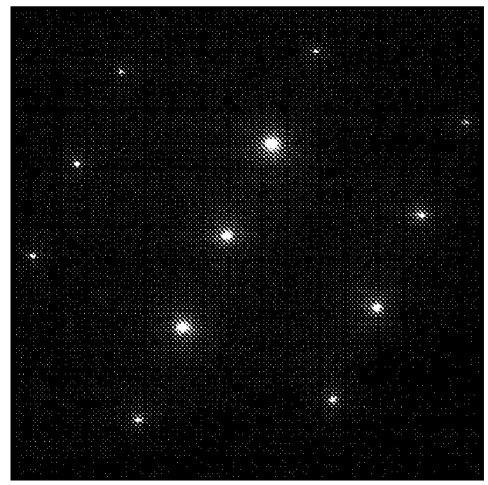
FIG. 5(b) depicts the corresponding electron beam diffraction pattern (DP) [6].
Figure 5A:
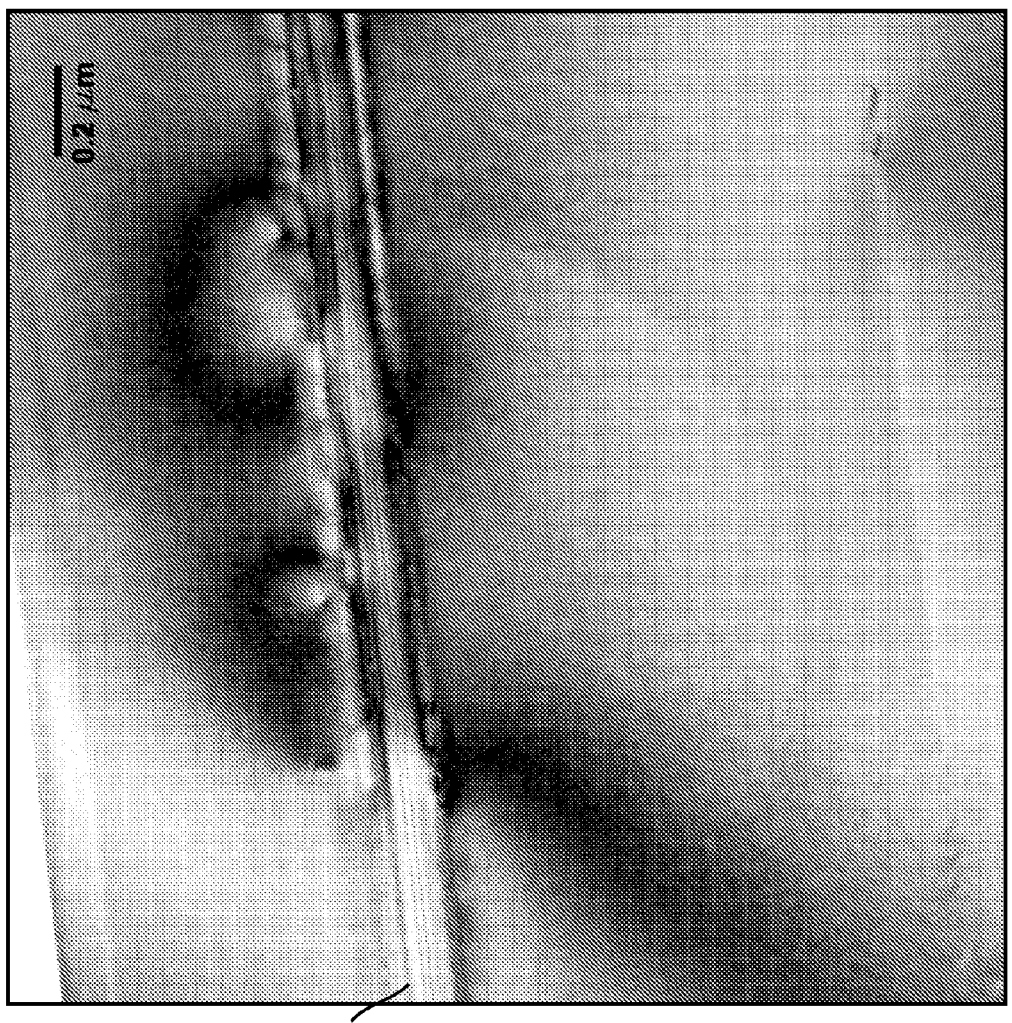
FIG. 5(a) is a TEM image around the [1-100] zone axis, wherein the whole semipolar (11-22) LD device epitaxial layers (from top to bottom), including the SL, can be seen, and the scale is 0.2 micrometers ($\mu$m)

FIGS. 4, 5(*a*), 6(*a*)-(*c*), 7, 8(*a*), and 9(*a*), are TEM images that illustrate the discovery that MDs 400 exist at heterointerface(s) 402 in semipolar (11-22) nitride-based epitaxial layers 404, 406. In this new discovery, the presence of MDs 400 was restricted to only around heterointerfaces between layers 404, 406 with lattice constant mismatch (with different alloys and/or alloy compositions). In other words, the epitaxial layer with MDs 400 restricted to the heterointerface 402 had no clear dislocation through the layers 404 and toward growth directions (perpendicular to the heterointerface 402). This indicates that the present invention provides a method to obtain a dislocation-free alloy template, with relaxed lattice constant, on the original substrate 406.

Due to the MDs, the lattice constant along one in-plane direction (perpendicular to the dislocation line direction) is relaxed. No relaxation occurred in the perpendicular in-plane direction (i.e. coherency was maintained).

FIG. 4 is a TEM bright field image taken with g=01-10 diffraction condition around the interface 402 of the lower part of a GaN/AlGaN SL 404 grown on (11-22) GaN 406, showing MDs 400 at the heterointerface 402.

FIG. 5(*a*) is a TEM image around the [1-100] zone axis, wherein the whole semipolar (11-22) LD device epitaxial layers (from top to bottom), including the SL, can be seen, and FIG. 5(*b*) depicts the corresponding electron beam diffraction pattern (DP) [6].

FIGS. 6(*a*)-(*c*) show TEM images of the different epitaxial layers of the aforementioned device showing (a) the 100 period p-AlGaN/GaN superlattice 600 and also showing 100 nm thick p-GaN 602, wherein the p-AlGaN in the superlattice 600 is 3 nm thick, the GaN in the superlattice 600 is 2 nm thick, (b) an active region 604 with a 2-period InGaN QW, and (c) an n-AlGaN/GaN SL 606 below the QWs 604.

Figure 7:
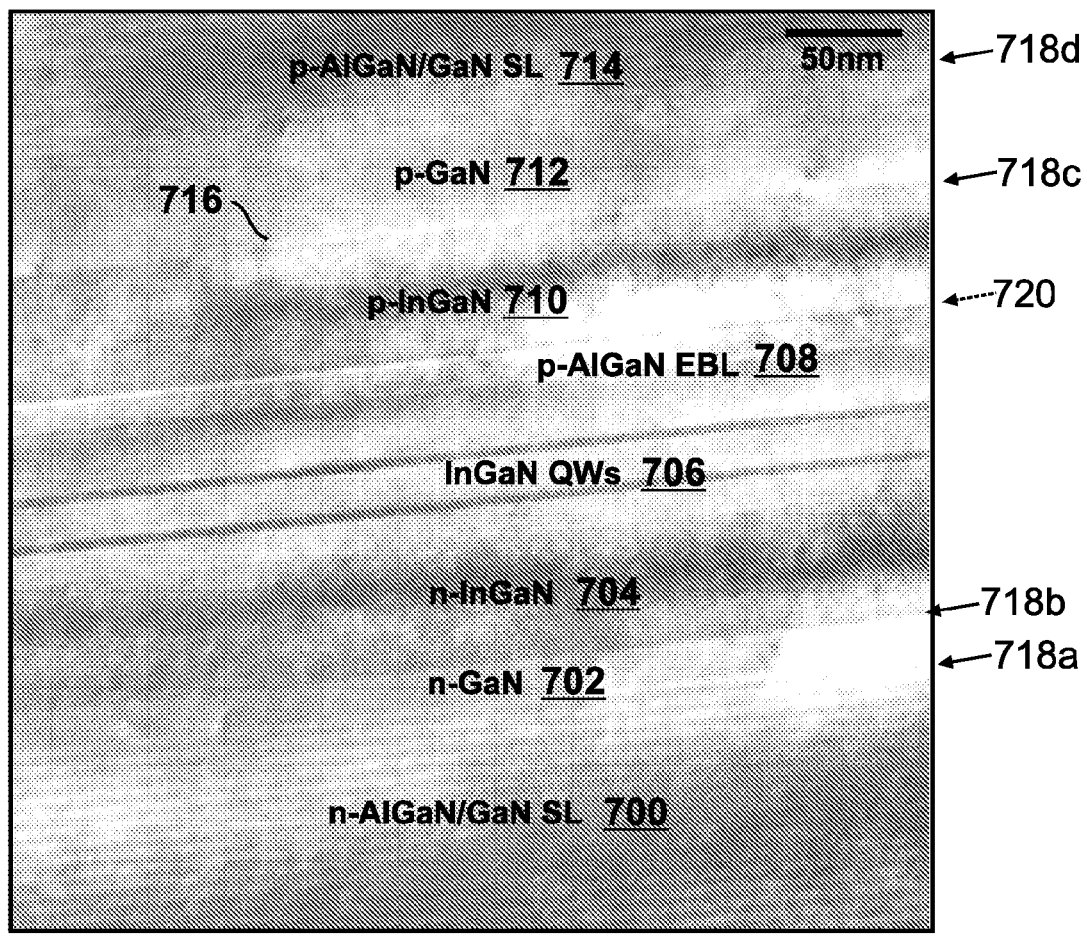
FIG. 7 is a TEM image illustrating MDs mainly generated at the heterointerfaces marked with black arrows, and slightly found in the layer marked with the broken arrow, wherein the scale is 50 nm.

FIG. 7 is a TEM image illustrating an epitaxial structure comprising an n-AlGaN/GaN SL 700, an n-GaN layer 702 on the SL 700, an n-InGaN layer 704 on the n-GaN layer 702, InGaN QWs 706 on the n-InGaN layer 704, a p-AlGaN electron blocking layer (EBL) 708 on the QWs 706, a p-InGaN layer 710 on the EBL 708, a p-GaN layer 712 on the p-InGaN layer 710, and a p-AlGaN/GaN SL 714 on the p-GaN layer 712. The TEM image further illustrates MDs 716 mainly generated at the heterointerfaces marked with solid black arrows 718*a-d*, and slightly found in the layer marked with the broken arrow 720.

FIG. 8(*a*) is a TEM image taken from the zone axis [2-1-10], and FIG. 8(*b*) depicts the corresponding electron beam DP.

Figure 9B:
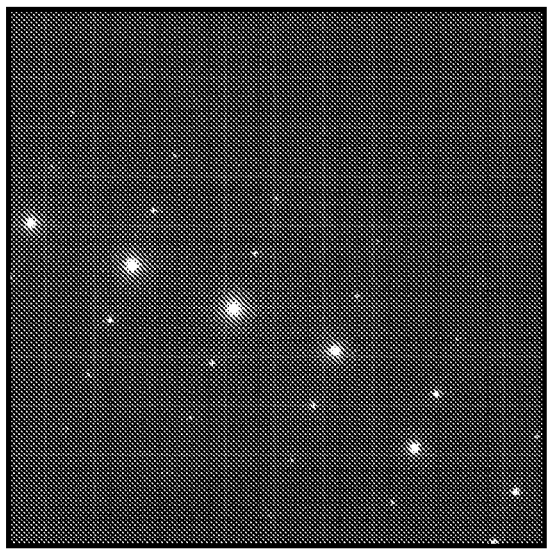
FIG. 9(b) depicts the corresponding electron beam DP.
Figure 9A:
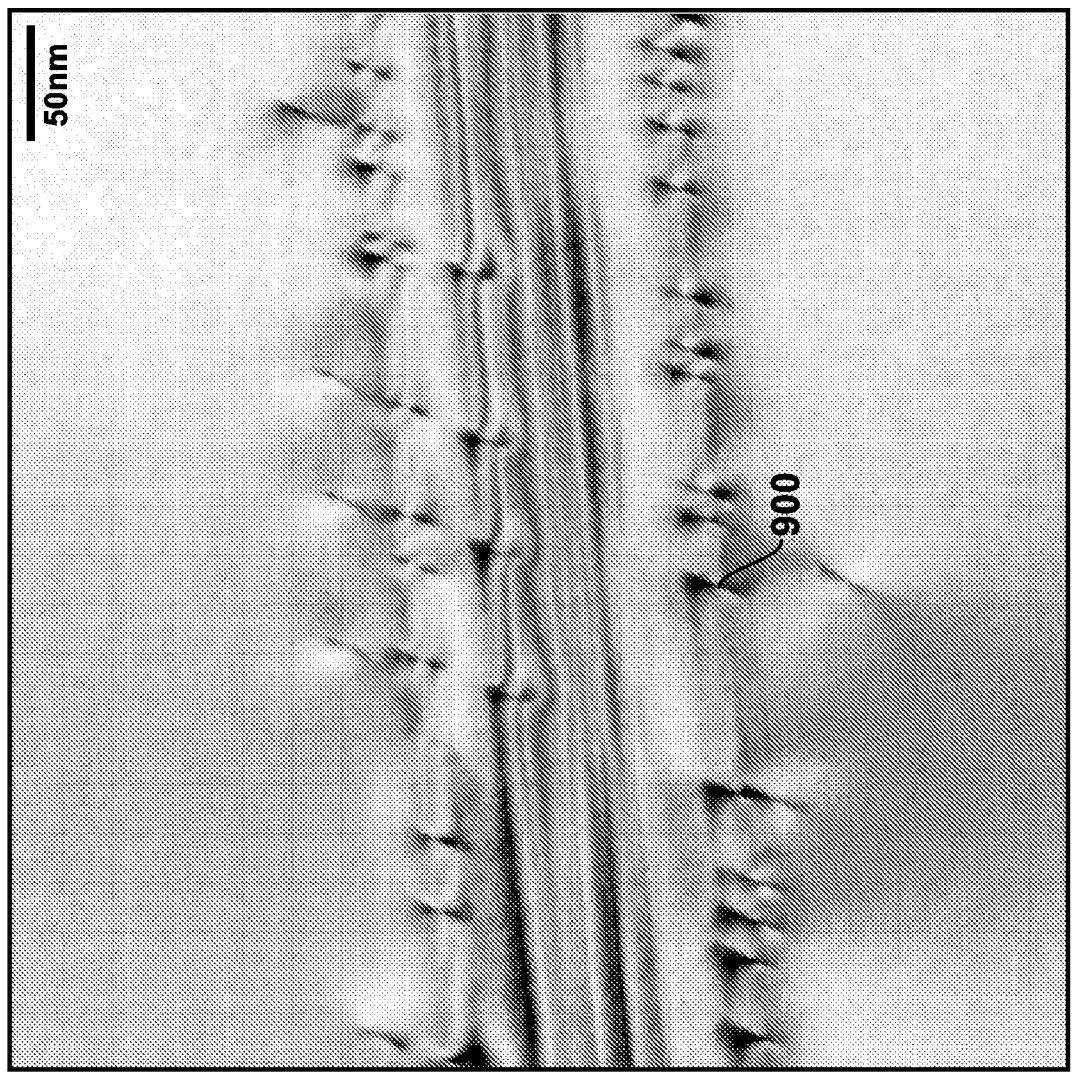
FIG. 9(a) is a TEM bright field image taken with g=01-10, wherein the MDs are seen as a segment due to tilting of the specimen from [1-100] to [2-1-10], wherein the scale is 50 nm.

FIG. 9(*a*) is a TEM bright field image taken with g =01-10, wherein the MDs 900 are seen as a segment due to tilting of the specimen from [1-100] to [2-1-10], and FIG. 9(*b*) depicts the corresponding electron beam DP.

Figure 10:
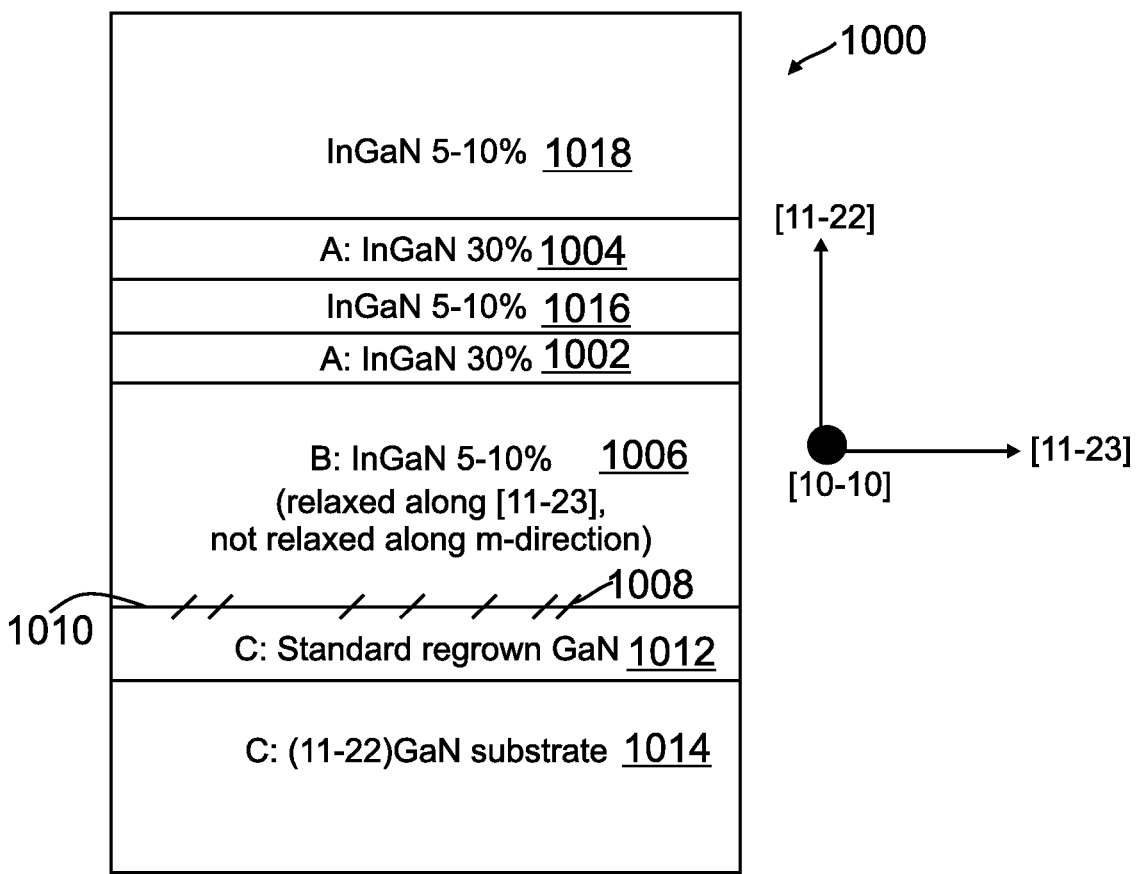
FIG. 10 is a cross sectional schematic of an epitaxial structure grown on (11-22) GaN corresponding to an embodiment of the present invention.

FIG. 10 illustrates an epitaxial structure for a III-Nitride based optical device 1000, comprising one or more active layers 1002, 1004 (also referred to as layer I or layer A, e.g. an InGaN layer with 30% In) with anisotropic strain on an underlying layer 1006 (also referred to as layer II or B, e.g., an InGaN layer with 5-10% In), where lattice constant and strain in the underlying layer 1006 are partially or fully relaxed in at least one direction due to the presence of MDs 1008. In FIG. 10, the underlayer 1006 is relaxed along the [11-23] direction but not relaxed along the m-direction [10-10]. The underlayer 1006 may be relaxed by the MDs 1008 at heterointerface 1010 below the underlayer 1006. The effect is that strain in the active layer 1002, 1004 (in particular, strain anisotropy) is modulated by the underlying layer 1006. In such a manner, band structure, optical matrix elements, spontaneous emission polarization, and gain can be modulated. Strain in layer I 1002, 1004 can be partially released and total strain can become smaller in layer I 1002, 1004 as compared to the case without layer II 1006. The amount of strain may depend on the actual composition used and the degree of relaxation. In one embodiment, it may be possible to relax up to ~50% of the strain. In the example of FIG. 10, layer 1006 is grown on layer 1012 (or layer III or C), which is standard regrown GaN. Layer III is grown on a (11-22) GaN substrate 1014, and InGaN layers 1016, 1018 with 5-10% In are grown on either side of layer 1002. Layer 1016 is a barrier between QWs, layer 1018 is a p-type layer, and layer 1006 is an n-type layer.

More specifically, strain anisotropy in QWs 1002, 1004 (e.g., layer A) may be controlled by the partially or fully relaxed-underlying layer 1006 (layer B) with localized MDs 1008 (see also FIGS. 4, 5(a)-(b), 6(a)-(c), 7, 8(a)-(b), and 9(a)-(b)), so that the band structure of the QWs 1002, 1004 can be modulated arbitrarily. $\epsilon_{11\text{-}23}$ (strain along the in-plane c-projection) is determined by the lattice constant difference between layers A and B. $\epsilon_{10\text{-}10}$ (strain along the m-axis) is determined by the lattice constant difference between layers A and C. The [11-22] direction and the [11-23] direction (parallel (∥) to the in-plane c-projection) are indicated by arrows in FIG. 10, and the [10-10] direction (perpendicular to the plane of the figure, indicated by the solid circle), is also shown in FIG. 10.

The active layer A may be an AlInGaN QW or MQW, for example. The effect is a high radiative recombination rate, higher gain, and additional band structure modulation due to the QW confinement effect [1-3].

In another example, layer II is InAlGaN (In composition>0), and layer I is InGaN (In composition>20%). The effect is that a luminescence polarization ratio can be controlled in blue, green, amber LEDs/LDs. The present invention can modify the optical matrix element and gain for this spectral region.

Figure 11:
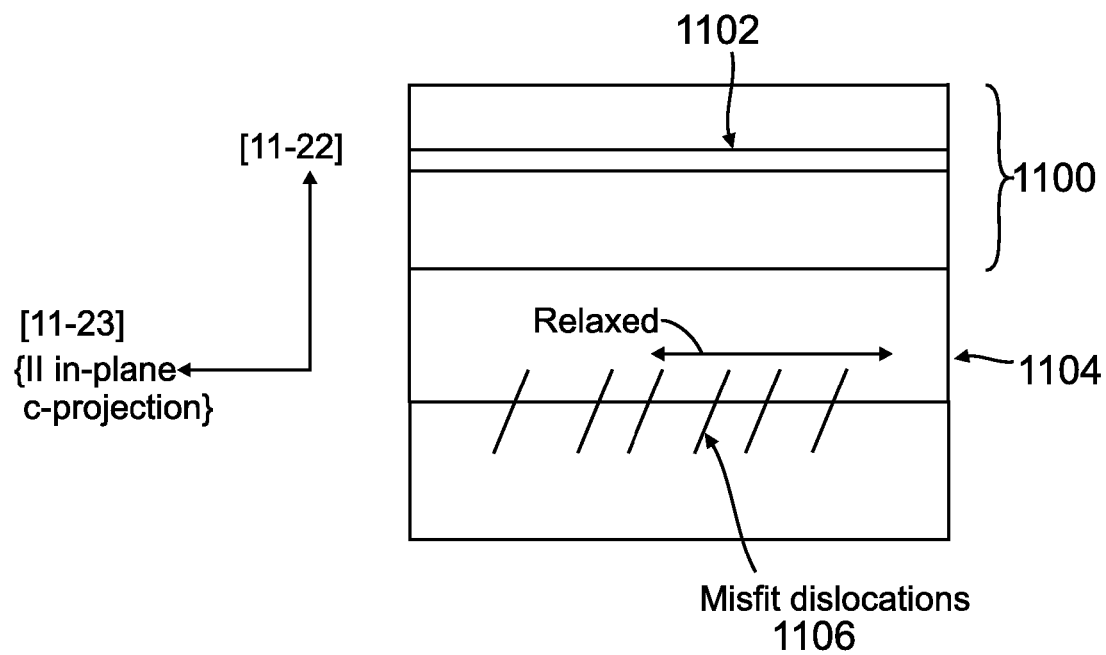
FIG. 11 is a cross-sectional schematic of an optical device structure, grown on (11-22) GaN, according to an embodiment of the present invention.

FIG. 11 illustrates an example of an optical device 1100 (e.g., LED or LD) comprising $In_{0.3}GaN$ QWs 1102 as the active layer, on an (11-22) oriented $In_{0.1}GaN$ underlayer 1104. The $In_{0.1}GaN$ underlayer 1104 is relaxed in the direction of the arrow labeled "relaxed," but is not relaxed along the m-axis direction (thus, relaxation occurs in one direction). Also shown are MDs 1106, the [11-22] direction (indicated by the arrow labeled [11-22]), and the [11-23] direction (which is parallel (∥) to the in-plane c-projection direction and indicated by the arrow labeled [11-23] {∥ in plane c-projection).

Figure 12:
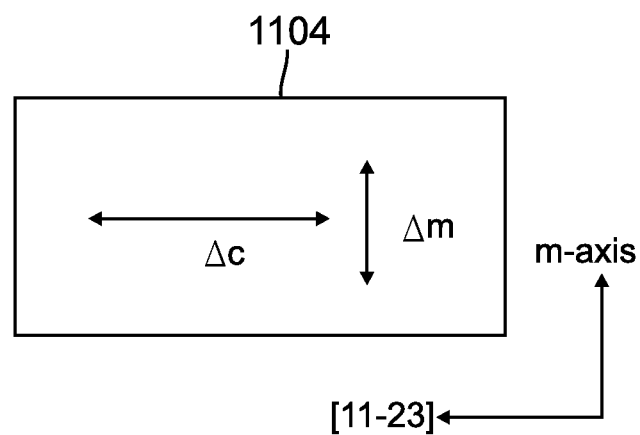
FIG. 12 is a top view of a layer in the optical device of FIG. 11.

FIG. 12 is a top view of the underlayer 1104 (e.g. $In_{0.1}GaN$, or InGaN with an In composition in the range 10% to 30%) in FIG. 11. The m-axis direction, the [11-23] direction, the lattice mismatch along the m-axis direction of the InGaN (Δm), and the mismatch along the in-plane c-axis projection direction of the InGaN (Δc), are all indicated by arrows in FIG. 12. The strain along the m-axis, $\epsilon_m$, is greater than the strain along the in-plane c-axis projection, $\epsilon_c$, which enables control of the InGaN underlayer's band structure, which affects the active layer's band structure ([1],[2], and [4]).

Figure 13:
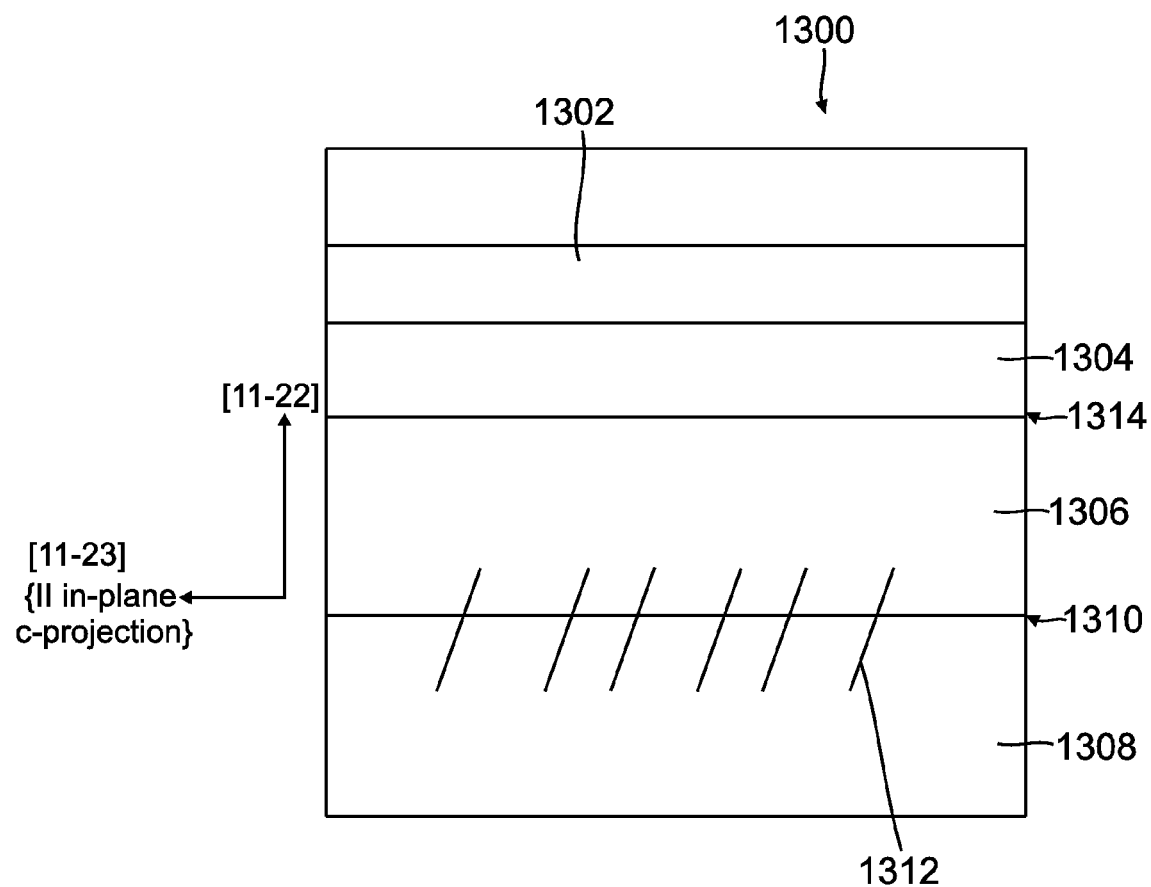
FIG. 13 is a cross-sectional schematic, along the (10-10) plane, of a device, grown on (11-22) GaN, according to the present invention.

FIG. 13 is an m-plane (10-10) cross-section of a structure 1300, comprising $In_{0.3}GaN$ QWs 1302 as the active layer, on an $In_{0.1}GaN$ layer 1304. The $In_{0.1}GaN$ layer 1304 is grown on an $In_{0.3}GaN$ underlayer 1306 epitaxially grown on a top surface of (11-22) GaN substrate 1312 (wherein the top surface is a (11-22) semipolar plane), thereby forming the heterointerface 1310 between the GaN substrate 1308 and the $In_{0.3}GaN$ underlayer 1306 has MDs 1312. The $In_{0.3}GaN$ underlayer 1306 is relaxed (strain free) in the direction of the in-plane c-projection [11-23] (indicated by the arrow labeled [11-23] {∥ in-plane c-projection}). The $In_{0.1}GaN/In_{0.3}GaN$ interface 1314 is also likely to have MDs. The [11-22] direction is also indicated by an arrow labeled [11-22].

Figure 14:
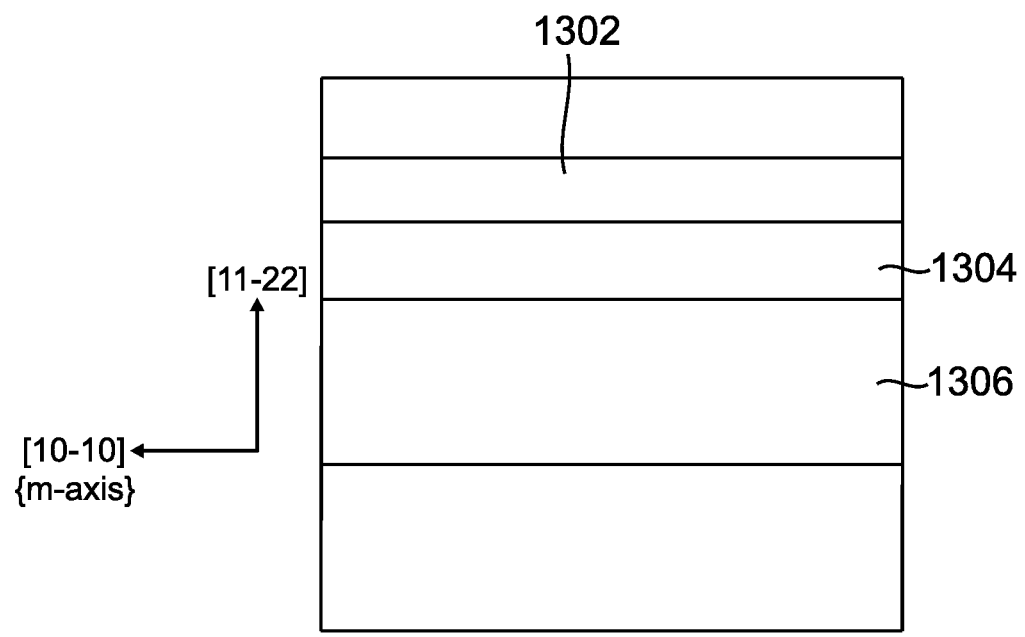
FIG. 14 is a cross-sectional schematic, along the (11-23) plane, of the device in FIG. 13.

FIG. 14 is a cross-section of the structure in FIG. 13, but along the (11-23) plane, showing the direction of the m-axis of III-Nitride (arrow labeled [10-10]). The InGaN underlayer 1306 comprising $In_{0.3}GaN$ is not relaxed along the m-axis, evidenced by no MDs. The strain $\epsilon_m$ in this case is caused by the difference in lattice constant between $In_{0.3}GaN$ 1306 and GaN 1308, leading to $\epsilon_{11\text{-}23}$ (or $\epsilon_c$)=0 and $\epsilon_m$<0 (i.e. compressive strain). The [11-22] direction is also indicated by an arrow labeled [11-22].

Process Steps

Figure 15:
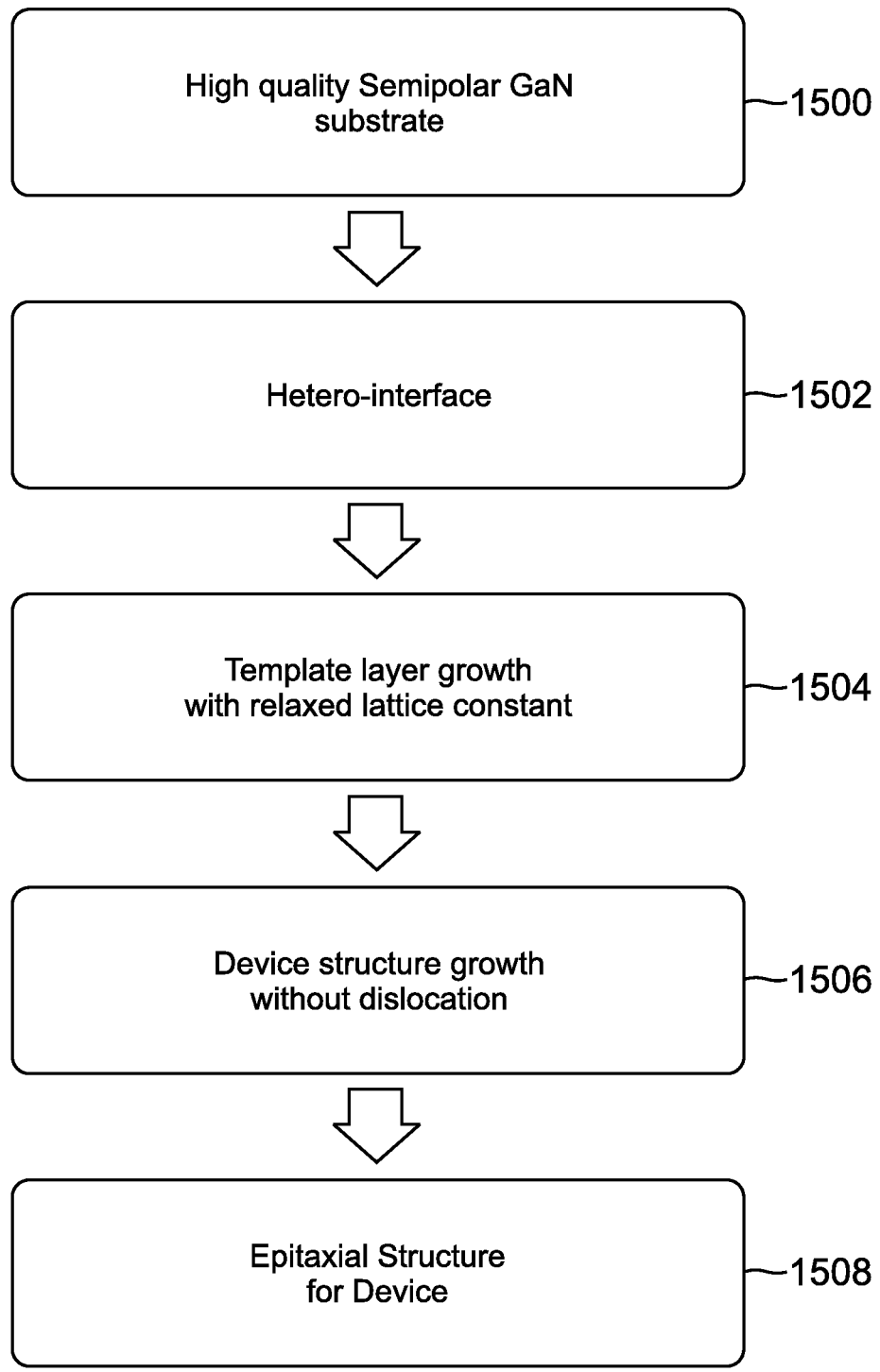
FIG. 15 is a flowchart illustrating a method of the present invention.

FIG. 15 is a flowchart illustrating a method of fabricating an epitaxial structure of the present invention (e.g., a III-Nitride based optical device structure). The method comprises the following steps.

Block 1500 represents providing a high quality semipolar GaN substrate that forms a heterointerface (Block 1502) with a subsequently grown template layer. The substrate may be a semipolar GaN substrate, for example, such as a (11-22) substrate, although other orientations are also possible, such as, but not limited to, (11-22), (10-1-1) or (10-1-3) planes, etc. Other substrates may be used such as, but not limited to, bulk AlInGaN, a high quality GaN substrate, m-sapphire substrate, or a spinel substrate. Nonpolar substrates may also be used.

Block 1504 represents forming (e.g., growing or depositing) one or more layers, underlayers, or template layers on the substrate, for example on the top surface of the substrate (wherein the top surface may be a semipolar plane, for example). The forming may comprise growing the template or underlying layer non-coherently on the substrate, thereby resulting in the template layer having a relaxed lattice constant. For example, the underlayer may be formed on the substrate so that a lattice constant and strain in the underlying layer are partially or fully relaxed against the substrate in at least one direction due to a presence of MDs at the heterointerface 1502 below the underlayer. In this way, the lattice constant in the underlayer, in the at least one direction, becomes its natural value rather than being constrained to a same value as a lattice constant of the substrate and the underlayer is strain free in the at least one direction.

The MDs may be caused by the heterointerface between the underlayer and the substrate or layer beneath the underlayer, wherein the underlayer and the substrate, or the underlayer and the layer beneath the underlayer, each have a different III-Nitride alloy composition, and the MD are localized around the heterointerface, thereby eliminating the MDs in layers around the active layer.

The underlayer is typically relaxed along the first direction but not relaxed along the second direction. The first direction may be parallel to an in-plane c-projection (X2) of the underlayer, and the second direction may be perpendicular to the first direction (e.g., m-axis direction).

The MDs are along the first direction that is relaxed. The MDs may be positioned to modulate the anisotropic strain such that strain in the active layer has a first strain in the first direction and a second strain in the second direction. A first strain in the underlayer may be smaller, along the first direction that is parallel to an in-plane c-projection (X2), than a second strain in the underlayer that is along the second direction.

Thus, the anisotropic strain may be modulated by a varying degree of relaxation in the underlayer as a function of direction in the underlayer. In this way, both the underlayer's and active layers' bandstructure (and other parameters as discussed throughout this disclosure) may be controlled, for example.

Typically, the in-plane lattice constant parallel to c-projection is relaxed, but the relaxed direction and non-relaxed direction does depend on the semipolar orientation and/or alloy composition of the underlayer and/or substrate. For commonly used semipolar planes, the lattice constants that are not coherent are typically the in-plane lattice constants parallel to the projection of the c-axis (which are different from both a, c).

As such, it is not necessary for the relaxed direction to be always along the c-projection and the non-relaxed direction always perpendicular to the c-projection. However, since basal plane slip is the dominant strain-relaxation mechanism owing to the crystal structure of semipolar wurtzite III-nitrides, MDs with line direction perpendicular to the c-projection would likely be formed first. Consequently, initial relaxation would be along the c-projection (relaxation direction is perpendicular to MD direction). If the strain energy in the film is large enough, the in-plane direction perpendicular to the c-axis can experience relaxation as well. In one embodiment, the present invention may calculate a critical thickness for formation of MDs for both directions. Then, MDs would be caused when the layer thickness reaches the corresponding critical thickness. Thus, once the layer thickness reaches critical thickness for a direction, the layer would be relaxed in the corresponding direction.

The degree of relaxation may depend on lattice constant, and mechanical properties depending on orientation and lattice directions [6].

Additional layer(s) beneath the underlayer may include other underlayer(s) that are coherently grown on the substrate. The layers above "underlayer" are coherently grown on "underlayer" with different lattice constant from the substrate because "underlayer" causes the relaxation of lattice constant. As long as the layer thickness is smaller than critical thickness, the material is grown coherently.

Block 1506 represents growing a device structure (e.g., active layer) on the underlying layer or template layer. The active layer may be deposited on a top surface of the underlayer, wherein the top surface of the underlayer is a semipolar plane. The device structure may be grown without dislocations on the template layer. The active layer may be formed on the underlying layer, so that anisotropic strain in the active layer is modulated or controlled by the underlying layer.

The underlying layer may be InAlGaN, with In composition>0, and the active layer may comprise InGaN with In composition>20%. The active layer may comprise one or more QWs having a thickness greater than 3 nm, and the MDs may be positioned to modulate the anisotropic strain such that light emitted by the QWs has a net X2 polarization.

The QWs may have an In composition and thickness such that the QWs emit light having a peak wavelength in a green spectral region. The QWs may be semipolar or nonpolar QWs.

The forming of the active layer may include growing the active layer coherently on the underlayer.

Block 1508 represents the end result of the method, an epitaxial structure for a device such as an optical device, comprising an active layer on a heterointerface with MDs, or on a partially relaxed or fully relaxed template layer. The epitaxial structure for the III-Nitride based optical device may comprise an active layer with anisotropic strain formed on an underlying layer, where a lattice constant and strain in the underlying layer are partially or fully relaxed against a substrate in at least one direction due to a presence of MDs at a heterointerface below the underlayer, so that the anisotropic strain in the active layer is modulated by the underlying layer.

The structure is typically grown using conventional Molecular Beam Epitaxy (MBE) or Metal organic Vapor Deposition (MOCVD), for example, although other deposition methods are also possible.

The device structure may be an optical device or an electronic device, for example (e.g., a transistor). Other layers, contacts or features may be added as known in the art to fabricate optoelectronic/electronic devices.

Non polar devices on nonpolar substrates may also be fabricated.

Advantages and Improvements

Figure 16:
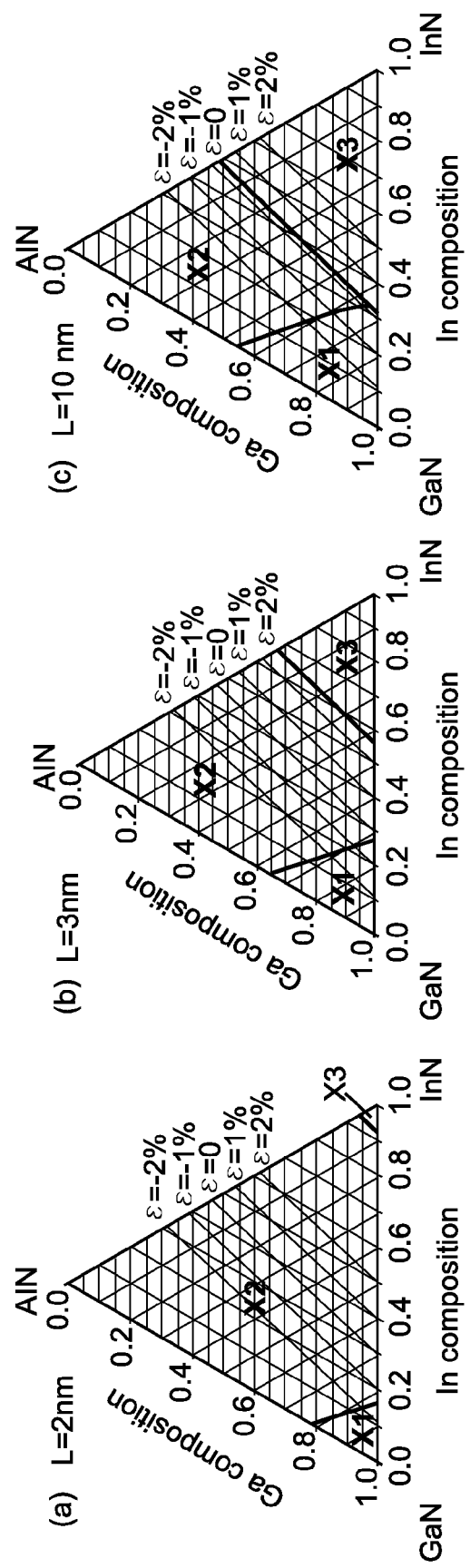
FIG. 16 illustrates the alloy composition dependence of the polarization which yields maximum optical matrix element in (a) 2 nm, (b) 3 nm, and (c) 10 nm thick $In_{0.3}GaN$ QWs on (11-22) oriented AlInGaN quaternary alloy substrates, according to Yamaguchi [1].

In the Yamaguchi paper [1], the strongest component among X1, X2, and X3 is changed by using InGaN or another quaternary substrate, as shown in FIG. 16 (taken from [1]). In this case, coherent growth on a substrate was assumed.

The present invention can break coherency in one direction in order to modulate strain in QWs and additionally modulate the band structure (i.e. luminescence polarization, gain etc.). From another point of view, the present invention achieves a relaxed-lattice-constant alloy-based template (substrate).

Strain relaxation for semipolar (11-22) QWs enables the present invention to: (1) easily obtain X2 polarization (which enables fabrication of m-axis cavity LDs with cleaved m-plane facets) with thick QWs, and (2) obtain longer wavelength emission from the LD or LED with the same In composition (i.e., for a given In composition, the present invention may obtain longer wavelength emission from an optical device than a device that is not fabricated according to the present invention). The present invention is quite effective for realizing LDs or LEDs that emit wavelengths corresponding to green light, for example.

Figure 17:
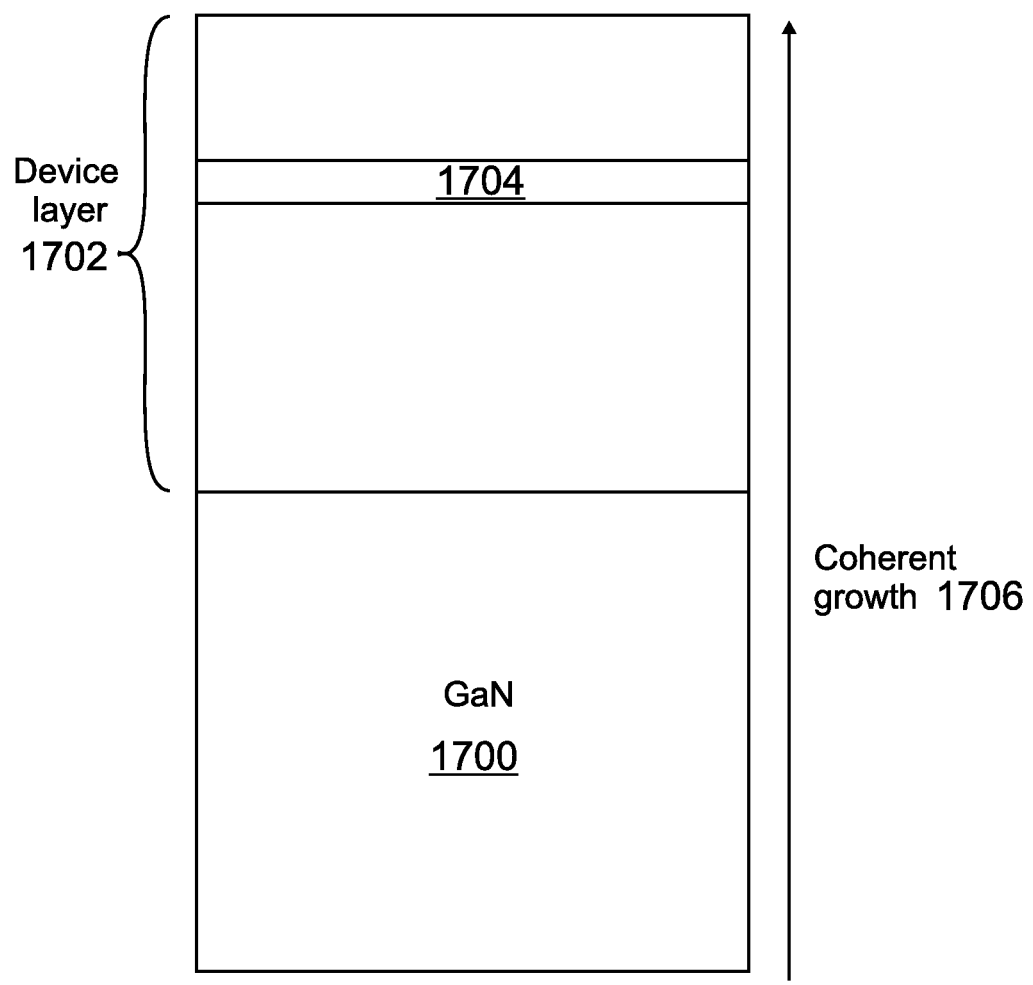
FIG. 17 illustrates a device employing coherently grown epitaxial layers.

The previous technology [5], as illustrated in FIG. 17, grows GaN 1700 and the device layers 1702 (including an InGaN QW 1704) on the GaN 1700 coherently 1706. In coherent growth, the lattice mismatch Δ (of the lattice constant) causes strain (e.g., compressive strain for the InGaN case). This causes large compressive strain $\epsilon$ in the InGaN active layer (e.g., 1704). In other words, the lattice mismatch Δ (where Δ is the lattice constant of the GaN substrate 1700 minus the lattice constant of the InGaN QW 1704) is negative, corresponding to compressive or compressional strain $\epsilon$ in the InGaN layer 1704). In the above calculation, GaN's lattice constant a=3.189 Å and GaN's lattice constant c=5.185 Å may be used [5].

Figure 18:
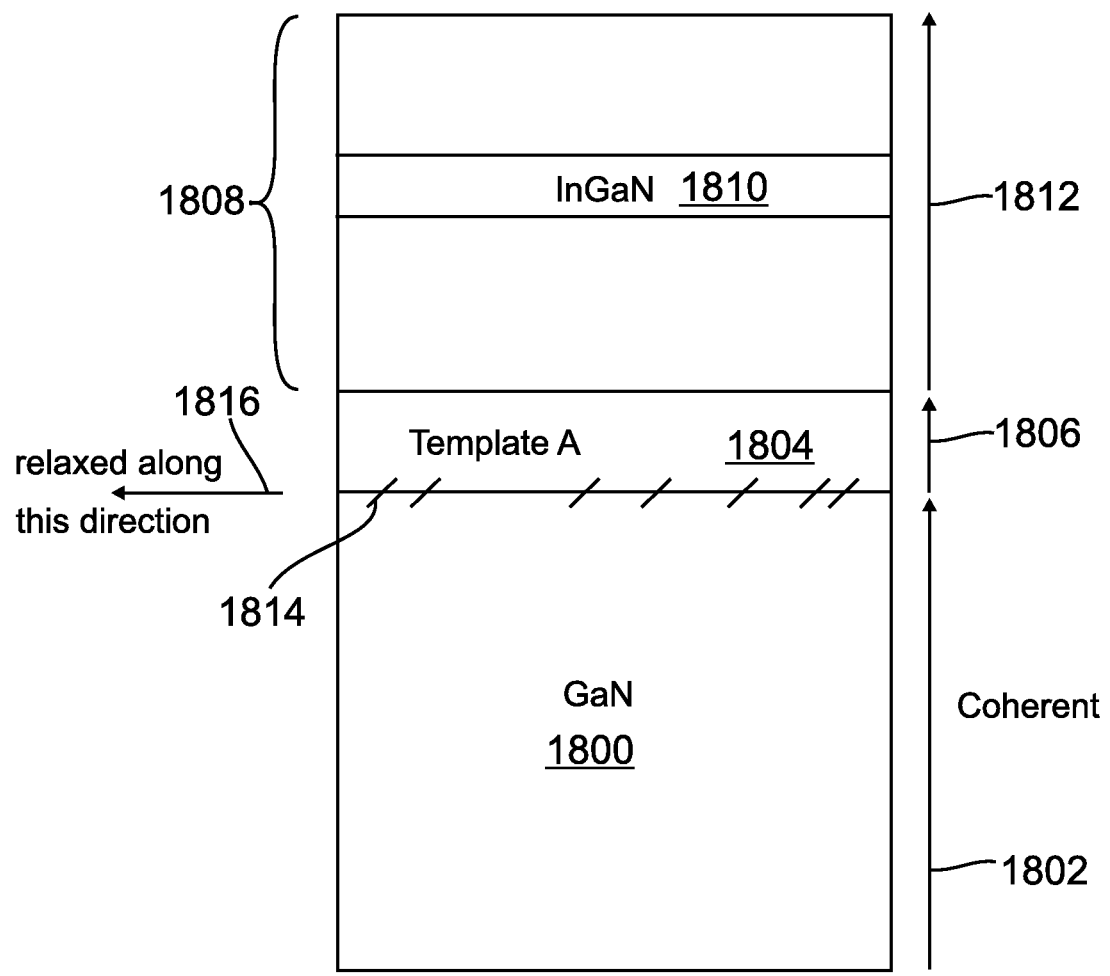
FIG. 18 illustrates a device grown using a non-coherently grown template, as described in present invention.

The present invention may achieve smaller compressive strain as compared to previous technology, as illustrated in FIG. 18. In FIG. 18, a GaN substrate 1800 or template is grown coherently 1802, and a template A (such as InGaN 1804) is grown non-coherently 1806 on the GaN substrate 1800 or template. The device layers 1808 (including InGaN QW 1810) may then be grown coherently 1812 on the template A 1804. The compressive strain is smaller than the case illustrated in FIG. 17. Specifically, in layer A 1804 above the interface with MDs 1814, the lattice constant, along the direction 1816 perpendicular to the MD line direction, is relaxed. The lattice mismatch Δ' (where Δ' is the lattice constant of template layer 1804 minus the lattice constant of InGaN QW 1810) is smaller than Δ in FIG. 17. In addition, strain $\epsilon'$ in the InGaN QW 1810 is smaller than $\epsilon$ in active layer 1704. In the above calculation, GaN's lattice constant a=3.189 Å, GaN's lattice constant c=5.185 Å, InN's lattice constant a=3.54 Å, and InN's lattice constant c=5.705 Å may be used [5]. $\Delta'\Delta\epsilon'$ and $\epsilon$ are calculated along the relaxed direction 1816.

An approach to reducing or possibly eliminating the polarization effects in GaN optoelectronic devices is to grow the devices on semi-polar planes of the crystal. The term "semi-polar planes" can be used to refer to a wide variety of planes that possess both two nonzero h, i, or k Miller indices and a nonzero l Miller index. Thus, semipolar planes are defined as crystal planes with nonzero h or k or i index and a nonzero/ index in the (hkil) Miller-Bravais indexing convention. Some commonly observed examples of semi-polar planes in c-plane GaN heteroepitaxy include the (11-22), (10-11), and (10-13) planes, which are found in the facets of pits. These planes also happen to be the same planes that the inventors have grown in the form of planar films. Other examples of semi-polar planes in the wurtzite crystal structure include, but are not limited to, (10-12), (20-21), and (10-14). The nitride crystal's polarization vector lies neither within such planes or normal to such planes, but rather lies at some angle inclined relative to the plane's surface normal. For example, the (10-11) and (10-13) planes are at 62.98° and 32.06° to the c-plane, respectively.

FIG. 18 illustrates the template layer 1804 grown on the top surface 1806 of the substrate 1800, wherein the top surface 1808 may be a semipolar plane, and the active layer 1810 grown on a top surface 1810 of the template or underlayer 1804, wherein the top surface 1808 may also be a semipolar plane.

The present invention may be used to fabricate LEDs or LDs emitting ultraviolet (UV) (e.g. by employing relaxed AlGaN semipolar templates), green, amber, or red light. The invention is particularly useful for LDs emitting green or UV light. The LEDs or LDs are typically based on (11-22) semi-polar planes (or other semipolar planes), e.g., based on semi-polar GaN, so that the devices are grown in semipolar orientations that reduce the quantum confined stark effect in light emitting active layers.

Moreover, generally, compressive strain may result in higher transition energies. Therefore, if the present invention reduces compressive strain for a high In composition InGaN active layer grown on the template or underlayer of the present invention, a longer wavelength emission with the same In composition may be obtained.

Figure 19:
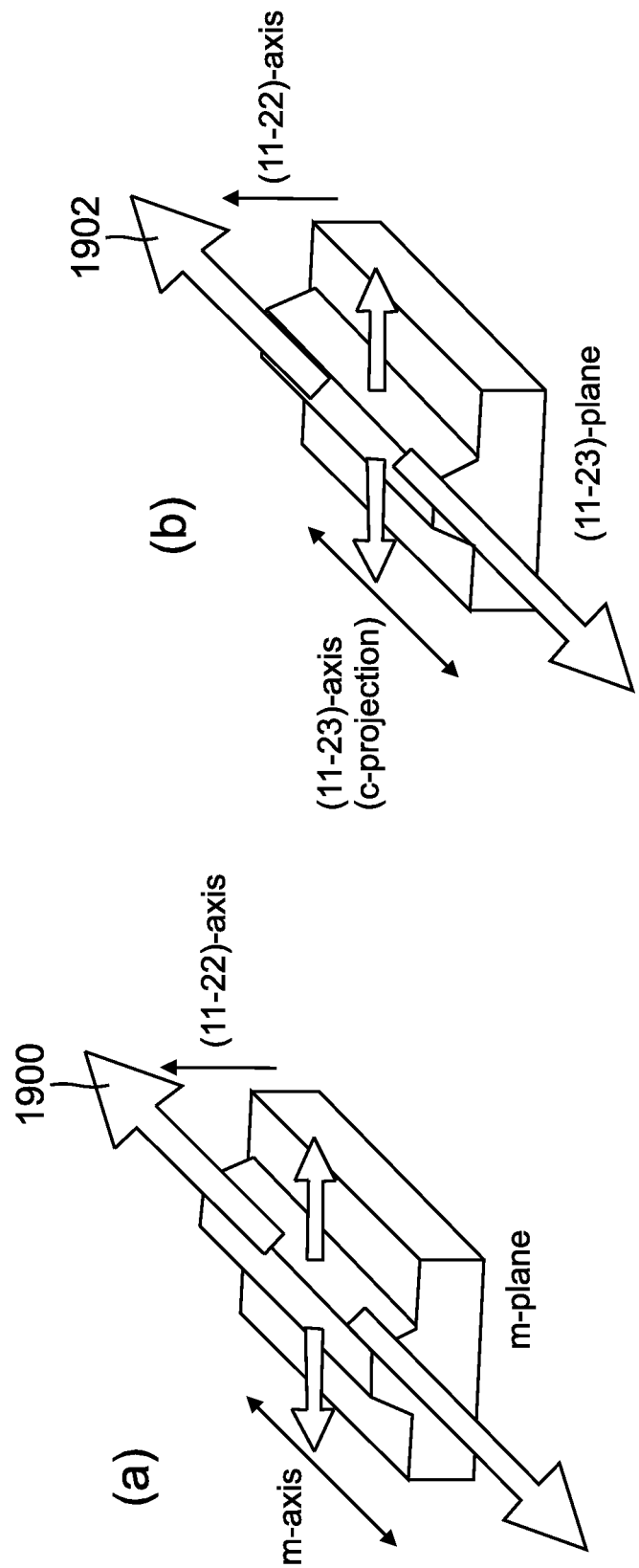
FIG. 19(*a*) illustrates an m-plane LD, showing the m-axis direction, 11-22 axis direction, and the directions of emitted light, and FIG. 19(*b*) illustrates a semipolar (11-23) LD, showing 11-23 axis (c-projection), 11-22 axis direction, and directions of emitted light.

FIG. 19(*a*) illustrates an (11-22) plane LD with m-plane mirror facets, showing the m-axis and 11-22 directions and the directions 1900 of emitted light, and FIG. 19(*b*) illustrates a semipolar (11-22) LD with (11-23) plane mirror facets, showing 11-23 axis (c-projection), 11-22 axis directions, and directions of emitted light 1902. In the LD with m-plane facets, if emission is with X2 polarization, polarization along (11-23) is stronger. In the LD with (11-23) mirror facets, if emission is with X1 polarization, then polarization along (1-100) is stronger.

For a (11-22) plane LD, where light 1902 emitted from the cleaved facets is polarized X2, some photons (not all) have the X2 polarization. The higher polarization ratio (the ratio of photons with X2 to those with X1) is preferable. The present invention is able to fabricate such (11-22) plane LDs.

However, optoelectronic devices (including LEDs, LDs), solar cells, and electronic devices (e.g., transistors such as high electron mobility transistors) may be grown on the template layer of the present invention.

Further information on the present invention may be found in [6-8].

References

The following references are incorporated by reference herein.

[1] A. A. Yamaguchi, Phys. Stat. Sol (c) 5, 2329 (2008).
[2] A. A. Yamaguchi, Appl. Phys. Lett. 94, 201104 (2009).
[3] A. A. Yamaguchi, Jpn. J. Appl. Phys. 46, L789 (2007).
[4] Physics of Optical Devices, by S. L. Chuang P149.
[5] I. Vurgaftman and J. Meyer, J. Appl. Phys. 94, 3675 (2003).
[6] "Partial strain relaxation via misfit dislocation generation at heterointerfaces in (Al,In)GaN epitaxial layers grown on semipolar (11-22) GaN free standing substrates," by Anurag Tyagi, Feng Wu, Erin C. Young, Arpan Chakraborty, Hiroaki Ohta, Rajaram Bhat, Kenji Fujito, Steven P. DenBaars, Shuji Nakamura, and James S. Speck, Applied Physics Letters 95, 251905 (2009).
[7] Presentation Slides given by James S. Speck, entitled "Progress in Nonpolar Materials and Devices," at the 2009 Annual Review for the Solid State Lighting and Energy Center (SSLEC), University of California, Santa Barbara (Nov. 5, 2009).
[8] "Lattice Tilt and Misfit Dislocations in (11-22) Semi-polar GaN Heteroepitaxy," by Erin C. Young, Feng Wu, Alexey E. Romanov, Anurag Tyagi, Chad S. Gallinat, Steven P. DenBaars, Shuji Nakamura, and James S. Speck, Applied Physics Express 3 (2010) 011004.

Conclusion

This concludes the description of the preferred embodiment of the present invention. The foregoing description of one or more embodiments of the invention has been presented for the purposes of illustration and description. It is not intended to be exhaustive or to limit the invention to the precise form disclosed. Moreover, it is not intended that the present invention be bound to any of the scientific principles or theories described herein. Many modifications and variations are possible in light of the above teaching. It is intended that the scope of the invention be limited not by this detailed description, but rather by the claims appended hereto.

What is claimed is:

1. A device, comprising:
   a semipolar or nonpolar III-Nitride active layer formed with anisotropic strain on or above an at least partially relaxed III-nitride layer.
2. The device of claim 1, further comprising:
   a non-polar or semi-polar surface of a III-nitride substrate; and
   the at least partially relaxed III-nitride layer on or above the non-polar or semi-polar surface of the substrate.
3. The device of claim 2, wherein the substrate is a Gallium Nitride (GaN) substrate.
4. The device of claim 1, wherein the active layer is free of dislocations.
5. The device of claim 1, wherein the anisotropic strain comprises a different strain in different directions of the III-nitride active layer, the different directions including:
   a first direction that is parallel to an in-plane c-projection and a second direction perpendicular to the first direction.
6. The device of claim 5, wherein the at least partially relaxed III-nitride layer is relaxed along the first direction and is not relaxed along the second direction, and the surface of the substrate is a semipolar plane.
7. The device of claim 1, further comprising:
   the active layer comprising one or more quantum wells having a thickness greater than 3 nanometers and with an Indium composition and strain such that the active layer emits light with a peak wavelength corresponding to green light.

8. The device of claim 1, further comprising:
the active layer comprising one or more quantum wells having a thickness greater than 3 nanometers and with an Indium composition and strain such that the active layer emits light with an X2 polarization.

9. The device of claim 8, wherein the device is a laser diode with a cavity bounded by cleaved m-plane facets.

10. The device of claim 1, wherein up to 50% of the strain in the active layer is relaxed.

11. The device of claim 1, wherein the at least partially relaxed III-nitride layer is Indium Gallium Nitride (InGaN).

12. The device of claim 1, wherein the at least partially relaxed III-nitride layer has between 10% and 30% Indium composition and the active layer comprises one or more Indium Gallium Nitride (InGaN) quantum wells with between 10% and 30% Indium composition.

13. The device of claim 1, wherein the at least partially relaxed III-nitride layer is Aluminum Gallium Nitride (AlGaN).

14. The device of claim 13, wherein the device emits light having a peak wavelength corresponding to ultraviolet light.

15. The device of claim 1, wherein the at least partially relaxed III-nitride layer is a superlattice.

16. A method of fabricating a device, comprising:
growing a semipolar or nonpolar III-Nitride active layer with anisotropic strain on or above an at least partially relaxed III-nitride layer.

17. The method of claim 16, further comprising controlling the strain anisotropy in order to control one or more of the following:
optical gain, bandstructure, luminescence polarization, optical matrix elements.

18. The method of claim 16, further comprising:
growing the at least partially relaxed III-nitride layer on or above a non-polar or semi-polar surface of a III-nitride substrate.

19. The method of claim 18, wherein the at least partially relaxed III-nitride layer is grown non-coherently on the substrate and the active layer is grown coherently on the at least partially relaxed III-nitride layer.

20. The method of claim 18, wherein the substrate is a GaN substrate.

21. The method of claim 18, further comprising:
controlling a lattice mismatch between the active layer and the at least partially relaxed III-nitride layer to control a strain in a first direction of the active layer; and
controlling a lattice mismatch between the active layer and the III-nitride substrate to control the strain in a second direction of the active layer perpendicular to the first direction.

22. The method of claim 18, wherein the at least partially relaxed III-nitride layer is relaxed in one direction that depends on one or more of the semipolar orientation and alloy composition of the substrate and the at least partially relaxed III-nitride layer.

* * * * *